(12) United States Patent
Nam

(10) Patent No.: US 6,466,042 B1
(45) Date of Patent: Oct. 15, 2002

(54) WAFER TYPE PROBE CARD WITH MICRO TIPS FOR TESTING INTEGRATED CIRCUIT CHIPS

(76) Inventor: Jae Woo Nam, 114-201, Byuck San Apt. Hong Eun-1 Dong Seo Dae Moon-Gu, Seoul 120-101 (KR)

( * ) Notice: Subject to any disclaimer, the term of this patent is extended or adjusted under 35 U.S.C. 154(b) by 0 days.

(21) Appl. No.: 08/731,315

(22) Filed: Nov. 26, 1996

(30) Foreign Application Priority Data

Dec. 2, 1995 (KR) .............................................. 95-46189

(51) Int. Cl.[7] ........................ G01R 1/073; H01L 21/66
(52) U.S. Cl. ........................ 324/754; 324/762; 438/18
(58) Field of Search .............................. 438/14, 17, 18; 257/48; 324/762, 754, 760

(56) References Cited

U.S. PATENT DOCUMENTS

| | | | |
|---|---|---|---|
| 4,937,653 A | * | 6/1990 | Blonder et al. ............. 257/739 |
| 5,172,050 A | * | 12/1992 | Swapp ........................ 324/762 |
| 5,177,438 A | * | 1/1993 | Littlebury et al. ........... 324/762 |
| 5,555,422 A | * | 9/1996 | Nakano ....................... 324/762 |
| 5,613,861 A | * | 3/1997 | Smith et al. ................. 324/754 |
| 5,625,297 A | * | 4/1997 | Arnaudov et al. ........... 324/754 |
| 5,625,298 A | * | 4/1997 | Hirano et al. ................ 324/762 |
| 5,864,946 A | * | 2/1999 | Eldridge et al. ............. 324/754 |

* cited by examiner

Primary Examiner—Ernest Karlsen
(74) Attorney, Agent, or Firm—Workman, Nydegger & Seeley

(57) ABSTRACT

A wafer probe card for a probing test of an integrated circuit chip on a silicon wafer is disclosed. As the wafer probe card is made of a silicon wafer and manufactured by a general wafer fabrication process, the wafer probe card having a desired silicon micro tip has the same physical characteristics as that of the silicon IC chip. Accordingly, when probing test of a semiconductor IC chip by connecting the silicon micro tip to a pad, all the chips on the wafer can be tested at the same time to thereby simplify and automate the process of the probing test.

16 Claims, 19 Drawing Sheets

WAFER TYPE PROBE CARD WITH MICRO TIPS FOR TESTING INTEGRATED CIRCUIT CHIPS

FIELD OF THE INVENTION

This invention relates to a probe card used in the probing test of a semiconductor IC chip and a manufacturing method thereof, and more particularly, to a wafer type probe card having micro tips for testing all the IC chips on a wafer simultaneously and a method for manufacturing the same.

BACKGROUND OF THE INVENTION

In recent years, the semiconductor industry has grown rapidly to a very-large-scale-integration (VLSI) technology, which has resulted in the essential of the test process of the integrated circuit (IC) chips formed on the semiconductor wafer for testing the failures of the IC chips.

There are testing methods of the IC chips. One is a wafer probing test for testing chips in a wafer state and the other is a final test for testing chips in a package state.

FIG. 12 shows a general wafer probing test system which can be used for the wafer probing test described above. Referring to FIG. 12, a wafer probing test apparatus comprises a wafer chip test system 100 for testing chips in a wafer state; and a test head 101 which is electrically connected to the wafer chip test system 100. The wafer 103 on which a semiconductor chip 103A is formed is mounted on a top of a chuck 105, and the chuck 105 is disposed on a wafer probe station 106. A probe card 102A shown in FIG. 13A having horizontal needles 108 is set up between the IC chip test head 101 and the wafer 103. In order to test failures of the semiconductor IC chip 103A, pads 104 formed on the semiconductor IC chip 103A are contacted with the horizontal needles 108 mounted on the probe card 102A. The probe card 102A having the horizontal needles 108 is electrically connected to the IC chip test head 101. Accordingly, the wafer chip test system 100 can test the failures of the semiconductor IC chip 103A with the aid of the horizontal needles 108 mounted on the probe card 102A which are contacted to the pads 104.

A conventional probe card 102A on which the horizontal needles 108 are mounted is shown in more detail in FIGS. 13A and 13B.

Generally, each of the horizontal needles 108 has a length ranging from 40 to 50 mm and a diameter range from 200 to 250 μm. The horizontal needles 108 are made of a conductive metal, preferably tungsten (W), however beryllium-copper (Be—Cu) or paliney-7 (P-7) may also be used as the material for the horizontal needles 108, considering factors such as hardness, degree of wear and conductivity, etc. Also a metal plated with gold (Au) or copper (CU) may also be used.

After the horizontal needles 108 having bent tips are manufactured from one of the materials described above, a needle module is completed by forming a probe ring 109 made of an epoxy resin for fixing the horizontal needles 108 onto the probe card 102A. Thereafter, the needle module is fixed onto a ready-made PCB of a probe card. Next, each of the horizontal needles 108 is fixed onto the signal pattern formed on the PCB by soldering. In this case, a microscope is required for working a series of processes necessary for manufacturing the needle module and fixing the horizontal needles 108 onto the PCB. Thus, it is very difficult to control the length of the horizontal needles 108 and to fix the positions thereof, when manufacturing the module needle.

It is also difficult to control and adjust the bending angle of the tips of the horizontal needles 108 when bending the tips. There are other difficulties such as a lengthy process for manufacturing the probe card and high failure rate of the probe card, because it is difficult to maintain a gap between the horizontal needles when mounting the needles onto the signal pattern.

Furthermore, there is another problem that frequency characteristics and impedance characteristics going bad because of the length of the needles 108. Also, controlling and adjusting the length, width and arrangement of the needles becomes more and more difficult and thus the failure rate increases because the needle module for testing a plurality of semiconductor IC chips is necessarily manufactured by depositing the needle layers in the second, third, and fourth level, etc., due to a spatial limitation in manufacturing the needle module according to the size, arrangement, pitch and position of the pads 104, which limiteds the number of needles that can be produced. Furthermore, it is difficult to control the tension of each of the needles with a constant value.

Accordingly, due to the problems described in detail above, there is a design limitation when pads are arranged on the semiconductor IC chip, which ultimately leads to a limitation of performance in a multi-chip test.

In FIGS., 14A & 14BB, another conventional probe card is show. the structure of a membrane-type probe card 202A is basically the same as that of the probe card having horizontal needles. However, in membrane-type probe card 202A, portions contacting the pads 104 mounted on a semiconductor IC chip are not the horizontal needles, but pointed bumps 212 which can softly contact with the pads 104. In this case, the tension of the bumps 212 is maintained by a flexible membrane 201 which resultingly leads to a constant contact force being maintained between bumps 212 and pads 104. Also, as another supplementary units for maintaining tension, a pressure maintaining adjustment tool 204 made of a pivot spring and a pressure-maintaining box cover 203 are formed on the membrane 201, for smoothly contacting the bumps 212 to the pads 104 and for prohibiting damages of the pads 104.

Although the membrane-type dot probe card provides substantial remedies for solving many drawbacks of the conventional probe card having horizontal needles, problems remain in the membrane- type dot probe card, because the structure thereof is basically that of a horizontal type. That is, there is, the manufacturing of the membrane-type dot probe card for testing a multiple of semiconductor IC chips has limitations resulting constant tension. Additionally, there is another problem that contact failure in some parts may occur between the bumps 212 and the pads 104, because it is difficult to control the tension of the membrane 201. Also, a contact failure between a wafer and a probe card may be occurr because each lengths of the bumps 212 may be very short.

SUMMARY OF THE INVENTION

For solving the above mentioned problems, it is an object of the invention to provide a wafer probe card having silicon micro tips which match with each pad on the wafer, to thereby unify the probing method. Therefore, wafer probing test is available irrelevant to the wafer on which any type of IC chip is mounted and it is possible to test all the IC chips simultaneously. Also, a burn-in test in the wafer state is also possible.

The preceding object should be constructed as merely presenting a few of the more pertinent features and applications of the invention. Many other beneficial results can be obtained by applying the disclosed invention in a different manner or modifying the invention within the scope of the disclosure.

Accordingly, other objects may be had by referring to both the summary of the invention and the embodiment in addition to the scope of the invention defined by the claims considered in conjunction with the accompanying drawings.

For the purpose of summarizing the invention, a wafer probe card having micro tips of the present invention comprises a substrate having a hollow in a portion of a semiconductor wafer, a main layer having a curved micro tip formed on said substrate and a sub layer formed on the main layer.

Also a method how to manufacture a wafer probe card having micro tips of the present invention comprises the steps of forming a $n^+$ diffusion layer on a silicon wafer, forming a main layer of a n− type epitaxial layer on the $n^+$ diffusion layer, etching a portion of the main layer by a photolithographic process, transforming the $n^+$ diffusion layer to a porous silicon by an anode reaction, etching the porous silicon layer, forming a sub layer of a metal or insulator on the main layer, forming a micro tip by thermal stress process for the main layer and sub layer.

The other method how to manufacture a wafer probe card having micro tips of the present invention comprises the steps of forming a n+ diffusion layer on a silicon wafer, forming a main-layer of polysilicon on the main-layer, forming a sub-layer of a thermal oxide layer on the main-layer, etching a portion of the main-layer and the sub-layer by a photolithographic process, transforming the n+ diffusion layer to a porous silicon layer by an anode reaction, etching the porous silicon layer, forming a micro tip by a thermal stress process of the main-layer and the sub-layer.

The more pertinent and important features of the present invention have been outlined above in order that the detailed description of the invention which follows will be better understood and that the present contribution to the art can be appreciated.

Additional features of the invention described hereinafter form the subject of the claims of the invention. Those skilled in the art can appreciate that the conception and the specific embodiment disclosed herein may be readily utilized as a basic for modifying or designing other structure for carrying out the same purpose of the present invention.

Further, those skilled in the art can realize that such equivalent constructions do not depart from the spirit and scope of the invention as set forth in the claims.

BRIEF DESCRIPTION OF THE INVENTION

For understanding the nature and objects of the invention, reference should be made to the following detailed description taken in conjunction with the accompanying drawings in which.

The novel features of the present invention may be understood from the accompanying description in conjunction with the accompanying drawings.

DETAILED DESCRIPTION OF THE PREFERRED EMBODIMENT

Figure 1A:
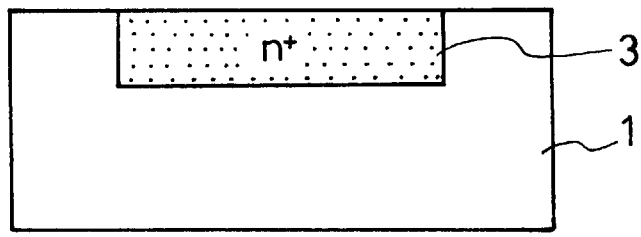
FIGS. 1A through 1E are cross-sectional views of the wafer probe card having a silicon micro tip, sequentially illustrating the formation of a main-layer according to the present invention.

FIGS. 1A through 1E show the -processes of fabricating a silicon wafer probe card according to the present invention, more in detail, which show the basic processes for fabricating a main-layer forming a silicon micro tip or a self-tension contactor. Referring to FIG. 1A, a $n^+$ diffusion layer 3 having a desired width and depth is formed on a n type silicon wafer 1.

Here, the method for manufacturing the main-layer forming a silicon micro tip will be described as below.

First, a n type silicon wafer 1 is cleaned by a standard cleaning process. Next, an oxide layer is grown on the n type silicon wafer to a depth of 8000 Å. Thereafter, a photoresist mask pattern is formed on the oxide layer for defining the area on which a silicon micro tip will be formed.

Next, a portion of the oxide layer, in which a $n^+$ diffusion layer 3 will be formed, is removed by a photolithographic process and the $n^+$ diffusion layer 3 having a depth of 20 μm is formed in the n type silicon wafer 1 by diffusing $POCl_3$. Finally, the remaining oxide layer on the silicon wafer 1 is removed.

Figure 1B:
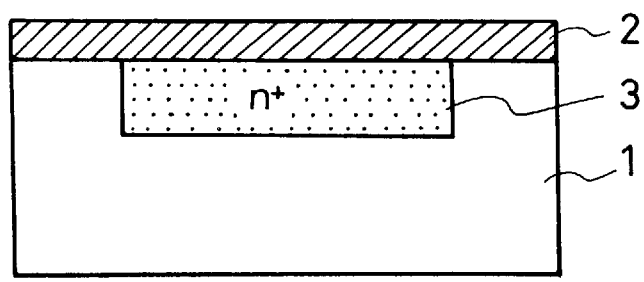

After the process of FIG. 1A, as shown in FIG. 1B, an n-epitaxial layer 2 for forming a main layer is deposited on the $n^+$ diffusion layer 3 and the silicon wafer 1. Here, the n-epitaxial layer 2 is made of a silicon having a resistivity of 10 Ω.cm and a thickness of 2 to 10 $\mu$m.

Figure 1C:
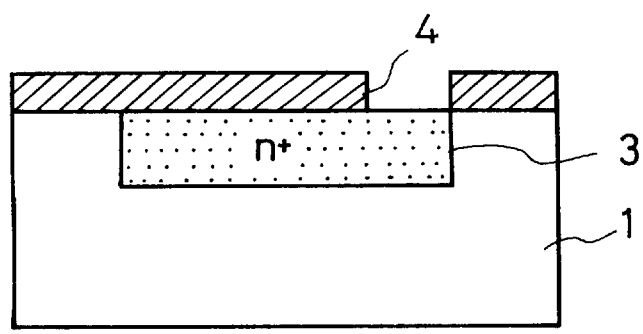

Referring to FIG. 1C, a photoresist is coated on the n-epitaxial layer 2 of FIG. 1B, and a mask pattern having a desired pattern is exposed by a photolithographic process. Thereafter, the n-epitaxial layer 2 is selectively etched by a wet etching method or dry etching method. Accordingly, a desired portion of the $n^+$ diffusion layer is exposed, and a main-layer 4 having a desired pattern is formed.

Figure 1D:
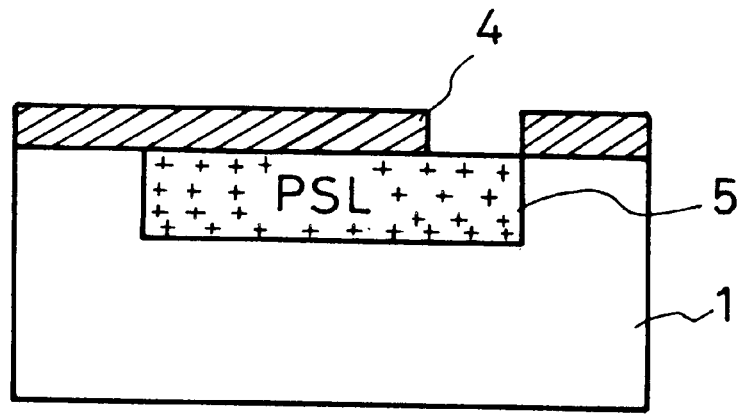

FIG. 1D shows the process of transforming the n+ diffusion layer 3 into a porous silicon 5. Here, the exposed $n^+$ diffusion layer 3 shown in FIG. 1C is transformed into a porous silicon 5(PSL) by an anode reaction which is performed by applying a constant voltage and current for a desired time to HF solution with high concentration, in which the exposed $n^+$ diffusion layer 3 is immersed.

Figure 1E:
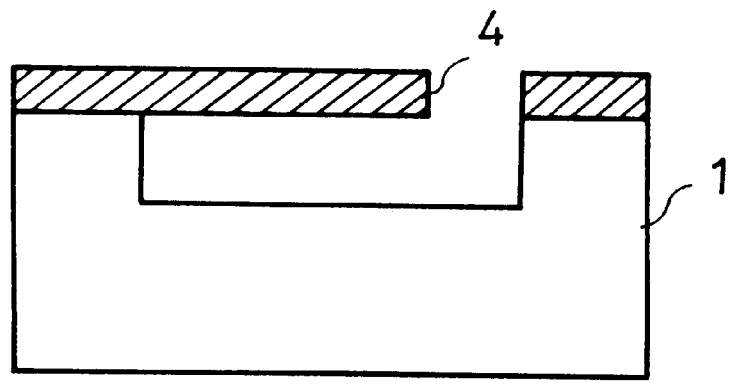

Next, FIG. 1E shows the process for removing the porous silicon 5 shown in FIG. 1D. Here, the n type silicon wafer 1 having the main layer on the porous silicon 5 is immersed into an enchant, for example, 5% NaOH solution to remove the porous silicon 5. Accordingly, the main layer 4 having a desired size and pattern is formed on the n type silicon wafer 1 having a hollow or cavity.

Figure 2A:
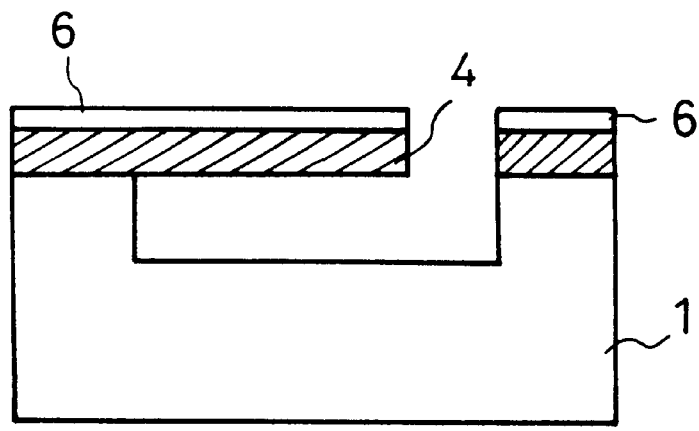
FIGS. 2A and 2B are cross-sectional views of the wafer probe card having a silicon micro tip, sequentially illustrating evaporation of a sub-layer on the main-layer shown in FIG. 1E.
Figure 2B:
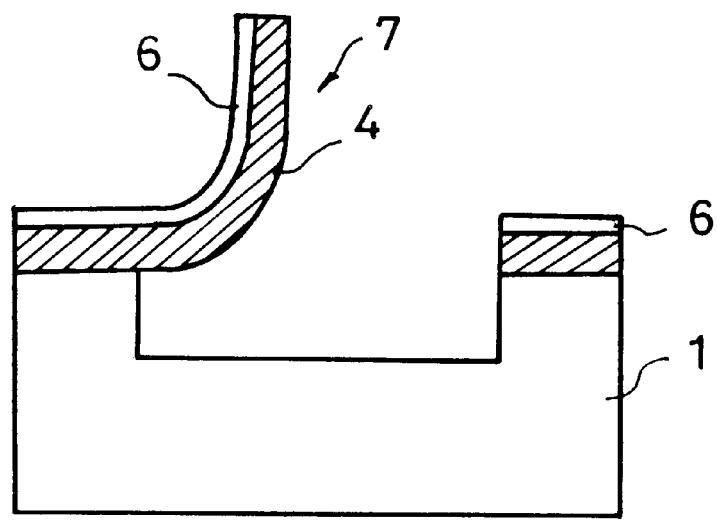

FIGS. 2A and 2B show the processes of fabricating a wafer probe card having a micro tip in accordance with one embodiment of the present invention.

In FIG. 2A, a sub-layer 6 made of a metal or an insulator is evaporated on the main-layer 4, in which the thermal expansion coefficient of the sub-layer 6 is less than that of the n-epitaxial layer which forms the main-layer 4.

In FIG. 2B, the main-layer 4 and sub-layer 6 of FIG. 2A are outwardly curved by an annealing process, to thereby form a silicon micro tip 7. Here, the sub-layer 6 is made of a metal with high conductivity and capability of forming a silicide. Accordingly, it is possible to fabricate the silicon micro tip of which a conductive silicide for a signal pattern is formed on the main layer 4.

Figure 3A:
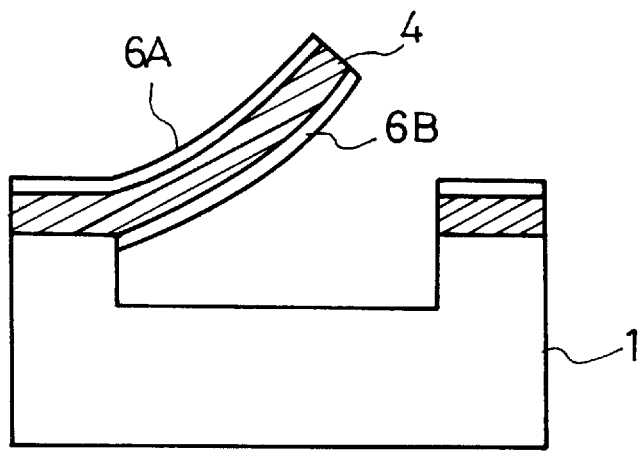
FIGS. 3A and 3B are cross-sectional views of another wafer probe card having a silicon micro tip, sequentially illustrating the formation of a thermal oxide layer on a main-layer according to the present invention.
Figure 3B:
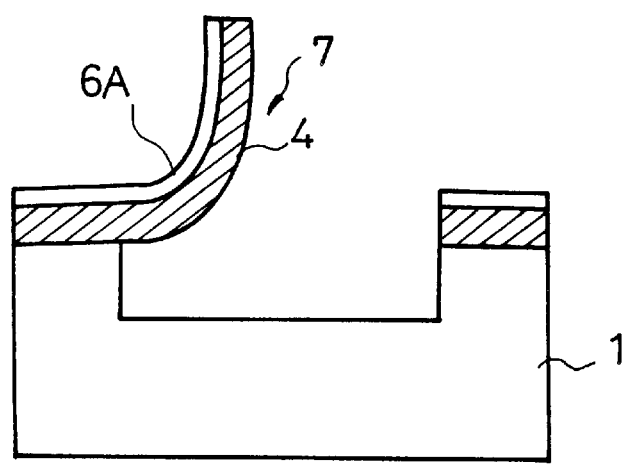

FIGS. 3A and 3B show the processes of fabricating a wafer probe card having a micro tip according to another embodiment of the present invention.

Referring to FIG. 3A, the exposed portion of the main layer 4 of FIG. 1E is thermally oxidized at high temperature, of 1300° C. At this time, an oxide layer 6A and 6B as a sub-layer having a thickness of several thousand Å are formed on and beneath the main layer 4, and it is curved due to the difference of a heat expansion coefficient difference between the main-layer 4 and the sub-layer 6A.

In FIG. 3B, a photoresist is coated on the thermal oxide layer 6A of FIG. 3A. Next, the thermal oxide layer 6B beneath the main layer 4 is removed by wet etching. Thereafter, a silicon micro tip 7 having a desired curvature is formed by an annealing process.

Figure 4A:
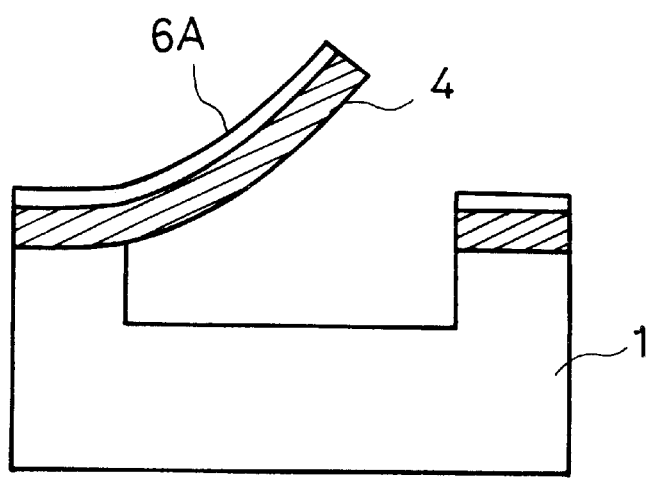
FIGS. 4A and 4B are cross-sectional views of another wafer probe card having a silicon micro tip, sequentially illustrating the formation of a thin film sub-layer on the thermal oxide layer shown in FIG. 3B.
Figure 4B:
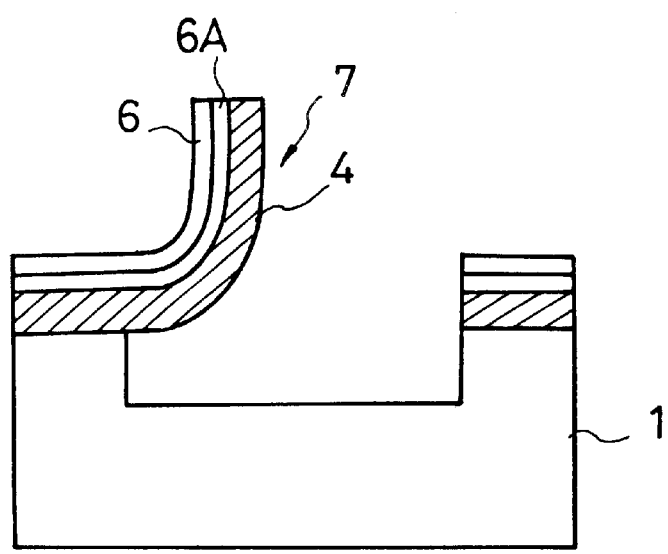

FIGS. 4A and 4B show the processes of fabricating a wafer probe card having a micro tip according to another embodiment of the present invention.

Referring to FIG. 4A, the silicon oxide layer 6B formed beneath the main-layer 4 shown in FIG. 3A is removed by wet etching.

In FIG. 4B, a thin film sub-layer 6, having a low heat expansion coefficient, for example, a metal or an insulator, is evaporated on the sub layer 6A. Next, by an annealing process finally, a silicon micro tip 7 is formed. At this time, the thin film sub-layer 6 is made of a conductive metal which can be formed to silicide. Accordingly, it is possible to fabricate the silicon micro tip 7 of which a conductive silicide for a signal pattern is formed on the main-layer 4.

FIGS. 5A through 5F sequentially show the processes of fabricating a main-layer of a wafer probe card having articular. The wafer probe card with a articular type micro tip of an articular type has the advantage of controlling the contact angle and contact force while contacting the micro tip to a pad.

Figure 5A:
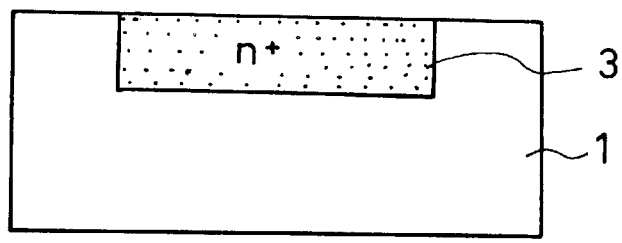
FIGS. 5A through 5F are cross-sectional views of the wafer probe card having a silicon micro tip of articular type sequentially illustrating the formation of a main layer according to another embodiment of the present invention.
Figure 5B:
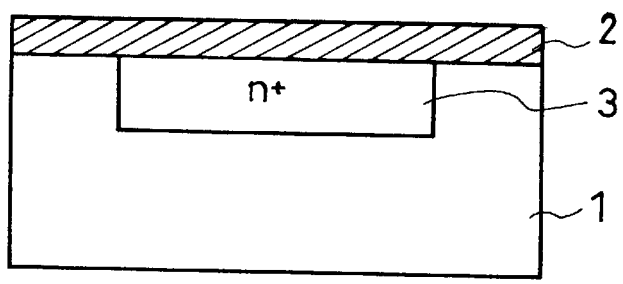

FIGS. 5A and 5B show the same processes as described for FIGS. 1A and 1B. For clarity, the more description thereof will be omitted.

Figure 5C:
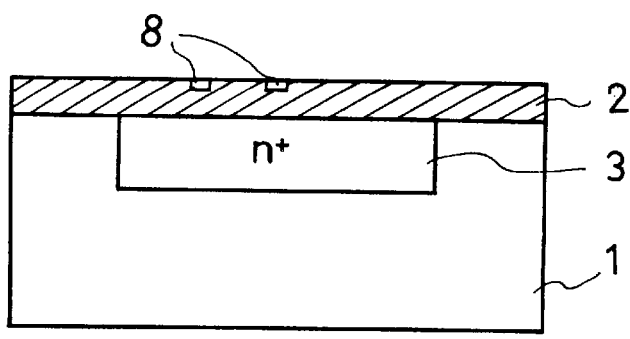

FIG. 5C shows the process of forming a $n^+$ type articulation 8 in an n-epitaxial layer 2 of FIG. 5B. Next, the portion of the photoresist, where the articulation 8 will be formed, is selectively etched by a photolithographic process. Thereafter, phosphorus is selectively diffused into the exposed n-epitaxial layer 2 to thereby form a $n^+$ type articulation 8.

Figure 5D:
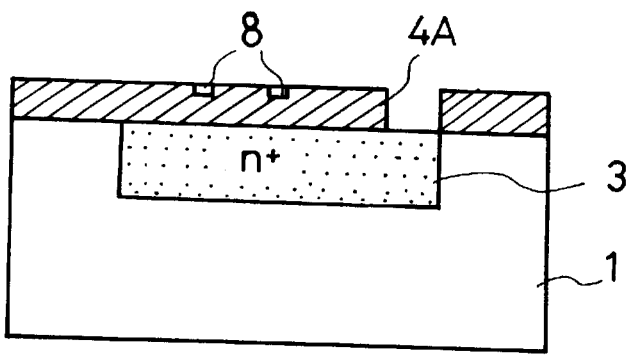
Figure 5E:
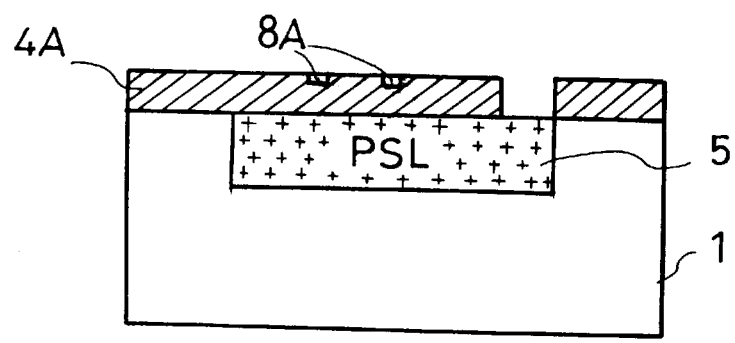
Figure 5F:
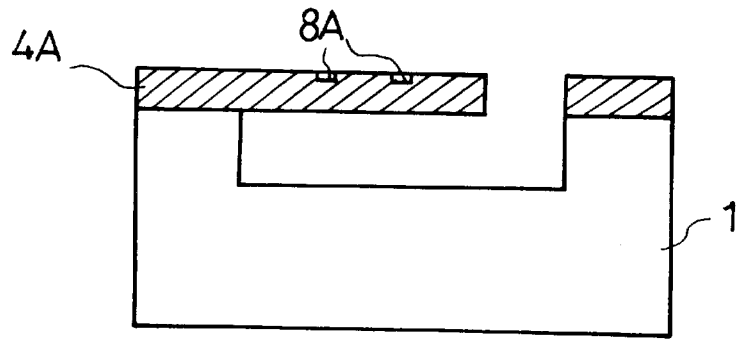

FIGS. 5D through 5F show the same processes as those of FIG. 1C through FIG. 1E, where, the $n^+$ diffusion layer 3 and the $n^+$ type articulation 8 are transformed into a porous silicon 5 and 8A, which are etched, to finally form a main-layer 4A having the articulation 8.

Figure 6A:
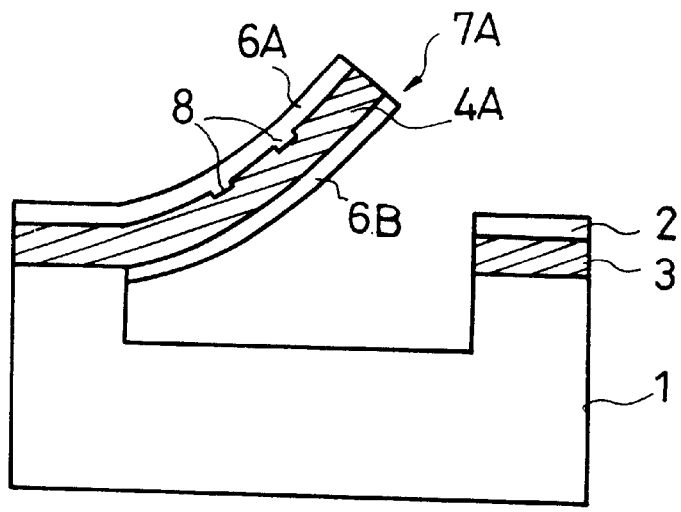
FIGS. 6A and 6B are cross-sectional views of the wafer probe card having a silicon micro tip of articular type sequentially illustrating the formation of a thermal oxide layer on the main-layer shown in FIG. 5F.
Figure 6B:
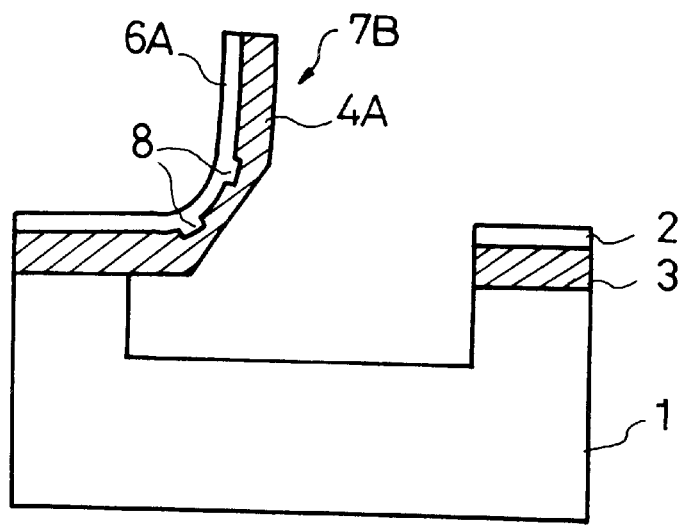

FIGS. 6A and 6B show the processes of fabricating an articular type silicon micro tip, in which the angle of curvature can be controlled exactly by an articulation.

Referring to FIG. 6A, an oxide sub-layer 6A having a predetermined thickness is grown on the articular type main-layer 4A of FIG. 5F by a thermal oxidation process at 1300° C. Here, a primitive curved silicon micro tip 7A is formed.

In FIG. 6B, a photoresist is coated on the oxide sub layer 6A for protecting the oxide sub-layer 6A on the primitive curved silicon micro tip 7A. Thereafter, the oxide sub layer 6B beneath the primitive curved micro tip 7A is removed. Finally, a silicon micro tip 7B having the articulation is formed by an annealing process.

Figure 7A:
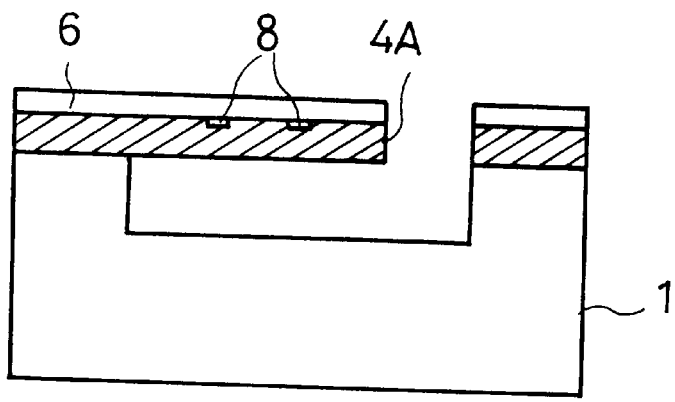
FIGS. 7A and 7B are cross-sectional views of the wafer probe card having a silicon micro tip of articular type, sequentially illustrating the formation of a thin film layer on the main-layer shown in FIG. 5F.
Figure 7B:
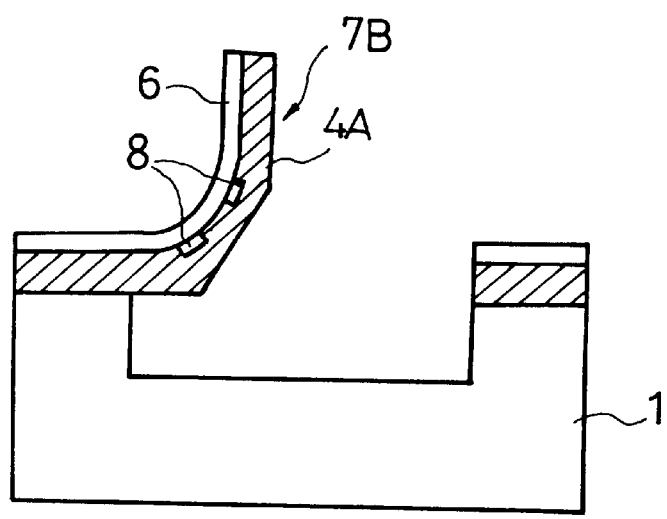

FIGS. 7A and 7B show the processes of fabricating another silicon micro tip having an articulation.

Referring to FIG. 7A, a sub-layer 6 of metal or insulator having a lower heat expansion coefficient than that of the n-epitaxial layer of the main-layer 4A of FIG. 5F is evaporated on the main-layer 4A.

In FIG. 7B, an annealing process at an appropriate temperature and for an appropriate duration is applied to the structure of the main-layer 4A and sub-layer 6. Accordingly, a silicon micro tip 7B having the articulation is formed, in which the structure of main-layer 4A and sub-layer 6 are outwardly curved. As described above, the sub-layer 6 on the main-layer 4A is made of a conductive metal, to thereby form a conductive silicide for a signal pattern.

Figure 8A:
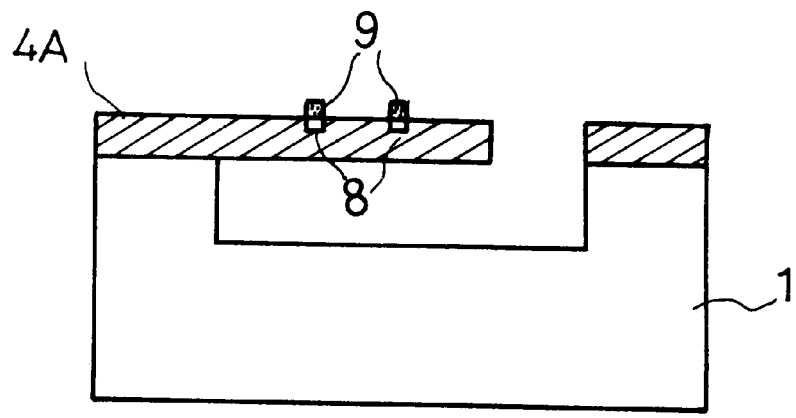
FIGS. 8A and 8B are cross-sectional views of the wafer probe card having a silicon micro tip of articular type sequentially illustrating the evaporation of a metal on the main-layer shown in FIG. 5F.
Figure 8B:
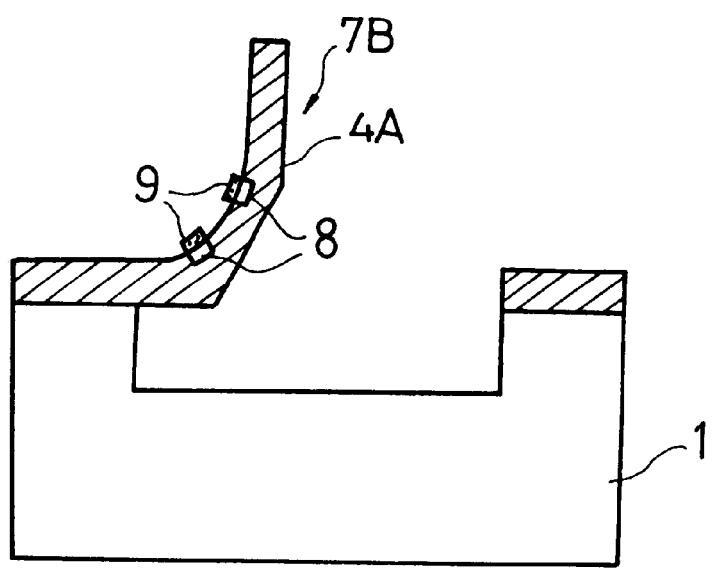

FIGS. 8A and 8B show the processes of fabricating another silicon micro tip having an articulation.

Referring to FIG. 8A, a metal film sub-layer 9 is evaporated only on the portion of the articulation 8 which is formed on the main-layer 4A of FIG. 5F. Here, the heat expansion coefficient of the metal film sub-layer 9 is less than that of the articulation 8. Next, in FIG. 8B, an annealing process for a proper temperature and time is applied to the main-layer 4A on which the metal film sub-layer 9 is evaporated, to thereby form a silicon micro tip 7B having an articulation whose curving angle can be controlled. Here, it can be noted that the articulation 8 have two states, one state having a porous silicon residing therein, another state having a porous silicon removed therefrom.

FIGS. 9A through 9F sequentially show the fabrication processes of another wafer probe card having a micro tip, which is made of a polysilicon having a polycrystalline structure according to another embodiment of the present invention.

Figure 9A:
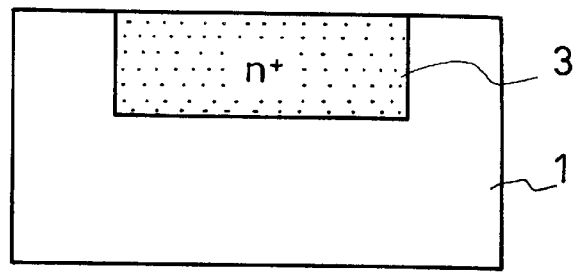
FIGS. 9A through 9F are cross-sectional views of a wafer probe card having a silicon micro tip, sequentially illustrating another formation of the silicon micro tip of the present invention.

Referring to FIG. 9A, a n+ diffusion layer 3 is formed in a n type silicon wafer 1 to a depth of 5 to 20 μm as described in FIG. 1A.

Figure 9B:
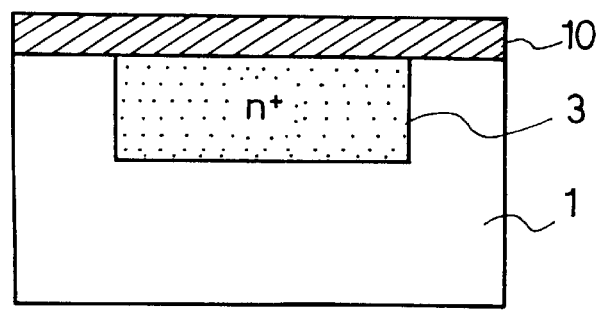

In FIG. 9B, a polysilicon 10 for forming a main-layer is evaporated on a portion of the silicon wafer 1 and a n+ diffusion layer 3 to the a depth of 5 to 20 μm.

Figure 9C:
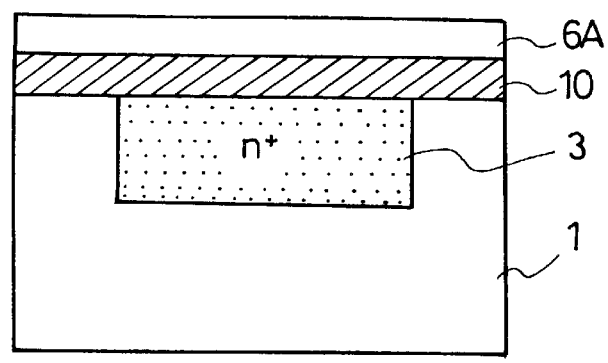

In FIG. 9C, a thermal oxide layer for forming a sub-layer 6A is grown on the polysilicon layer 10 to a depth of several thousand Å.

Figure 9D:
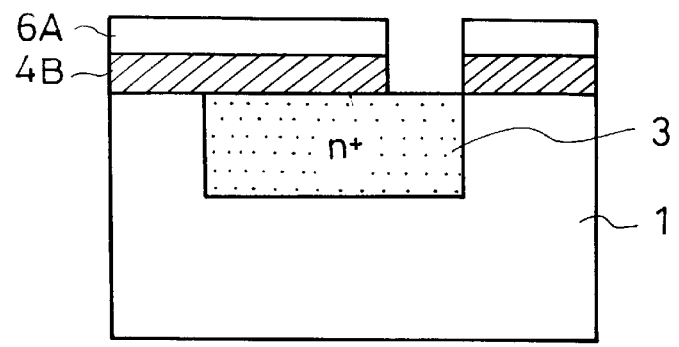

In FIG. 9D, for manufacturing a desired type's main-layer 4B, a photoresist is coated on the sub layer 6A and by photolithographic process, a mask pattern having a desired pattern is formed thereon. Thereafter, for fabricating a through-hole and minor structure when an anode reaction is applied, the sub-layer 6A and the polysilicon 10 are selectively etched by a wet etching or a dry etching, to thereby expose the n+ diffusion layer 3.

Figure 9E:
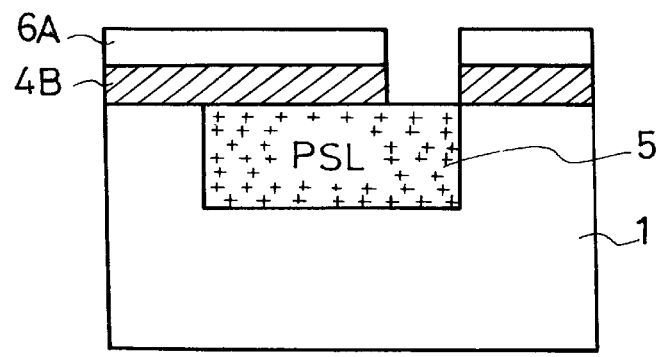

Next, in FIG. 9E, an anode reaction using a constant voltage and constant current is applied to the structure in a HF solution, as shown in FIG. 9D. Accordingly, the n+ diffusion layer 3 is transformed into a porous silicon layer 5.

Figure 9F:
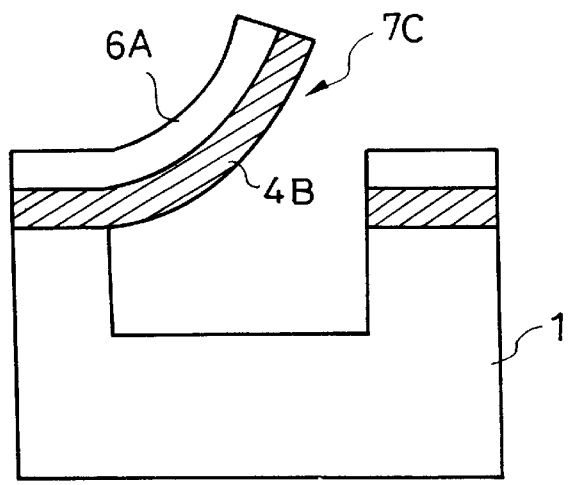
Figure 10A:
FIG. 10 shows photographs of a silicon micro tip according to the present invention.
Figure 10B:
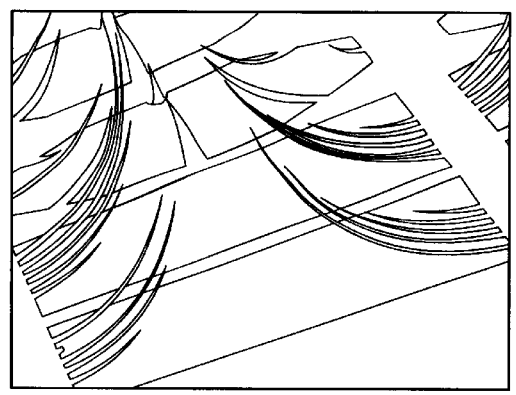
Figure 10C:
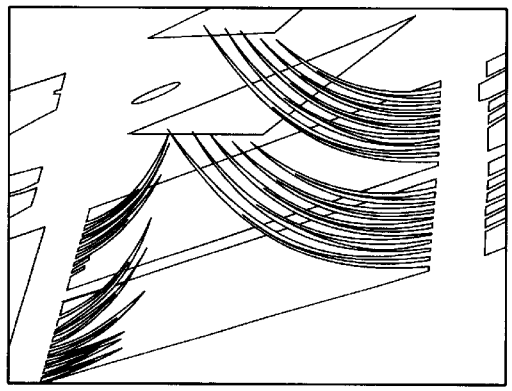
Figure 10D:
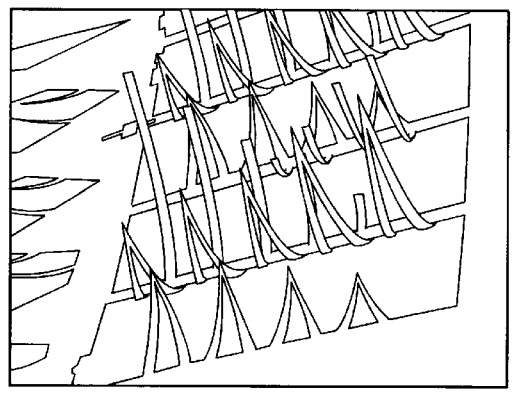
Figure 10E:
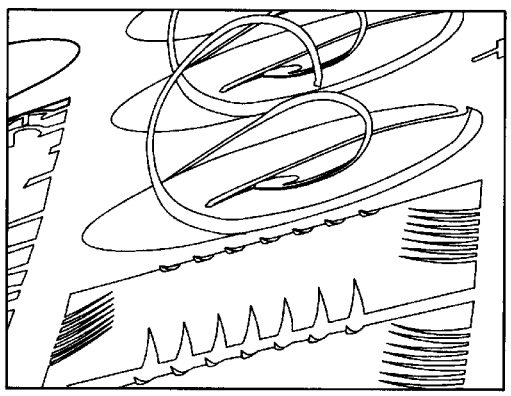
Figure 10F:
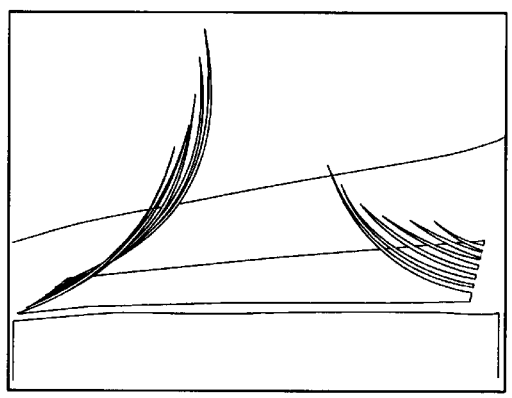

Finally, in FIG. 9F, the porous silicon layer 5 is etched by a 5% NaOH solution. Next, an annealing process having a proper temperature is applied to the whole structure to thereby form a polysilicon micro tip 7C.

FIG. 10 shows photographs of a silicon micro tip having a variety of patterns, manufactured by the above described processes. As shown, a desired pattern for the silicon micro tip and a desired curvature having a constant height and degree can be manufactured.

Figure 11:
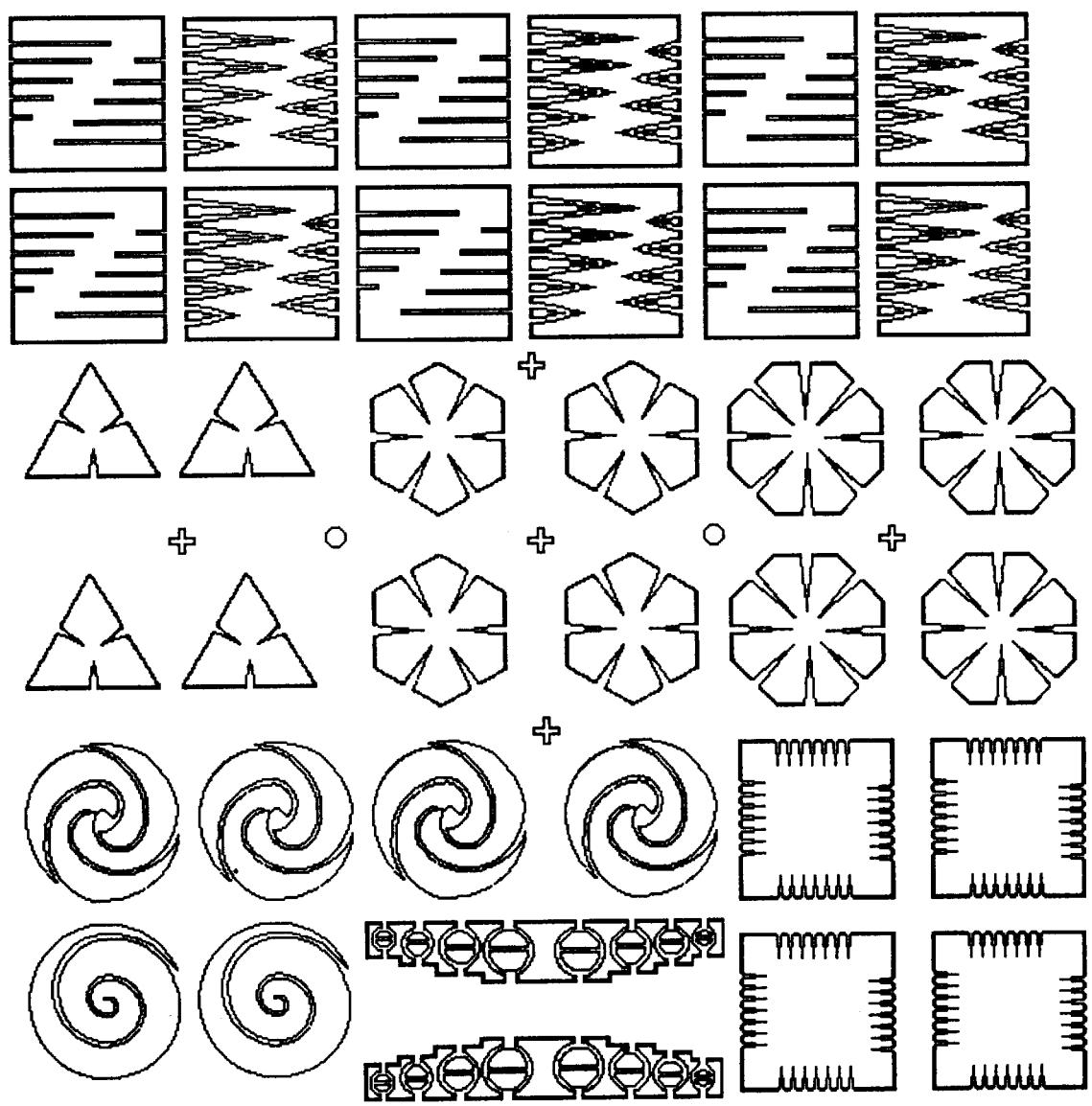
FIG. 11 shows plan views of mask patterns for manufacturing a silicon micro tip according to the present invention.
Figure 12:
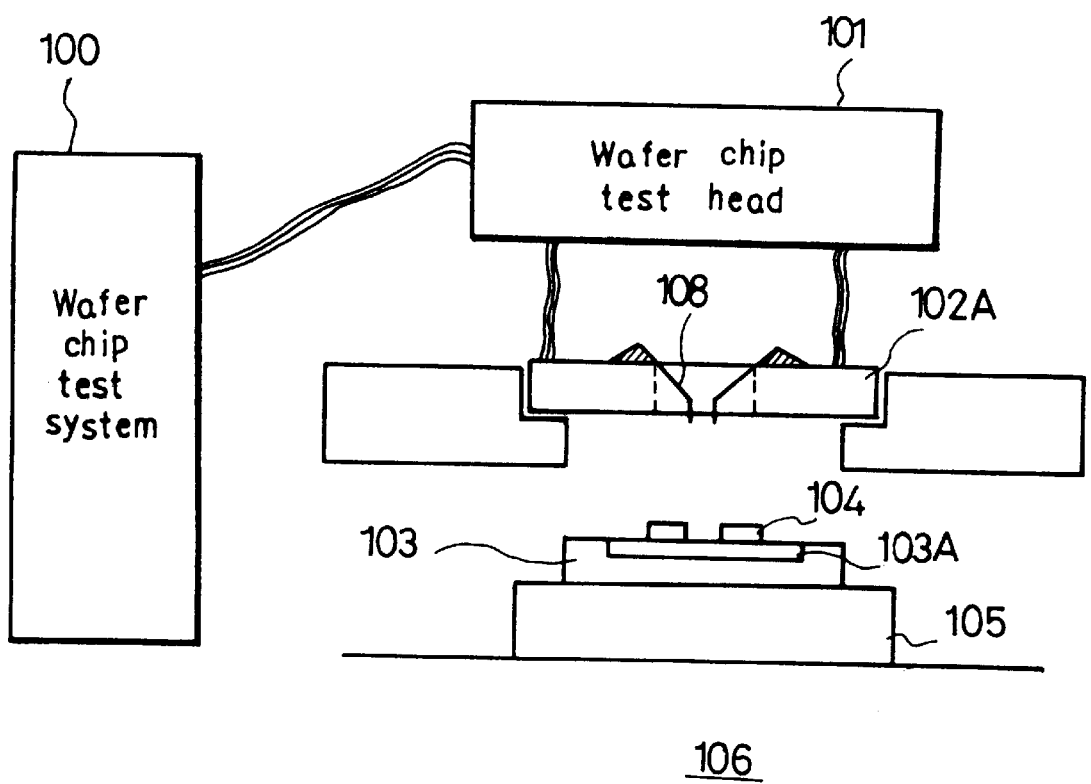
FIG. 12 is a schematic diagram of a probing test apparatus of an IC chip according to the prior art.
Figure 13A:
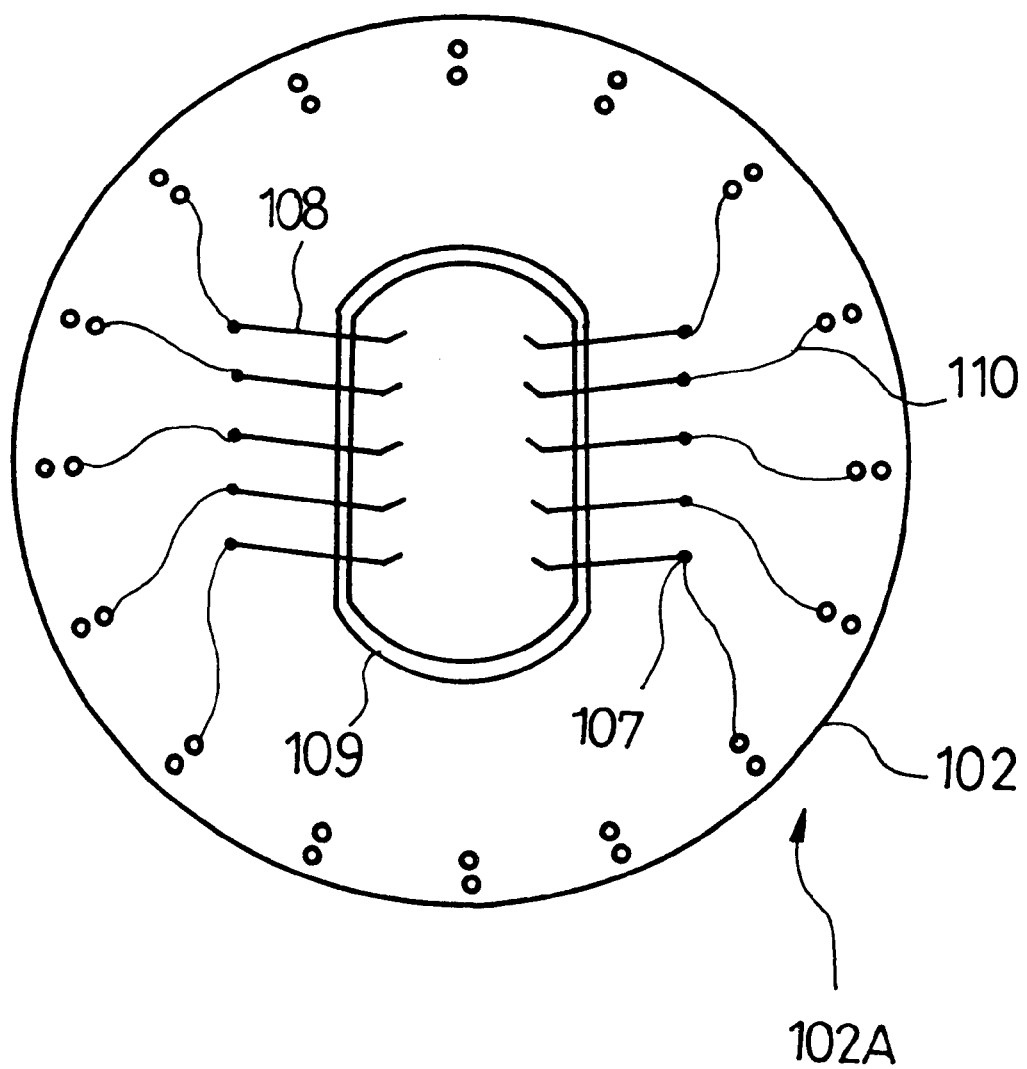
FIG. 13A is a top view of a probe card having a horizontal type needle for performing a probing test of an IC chip according to the prior art.
Figure 13B:
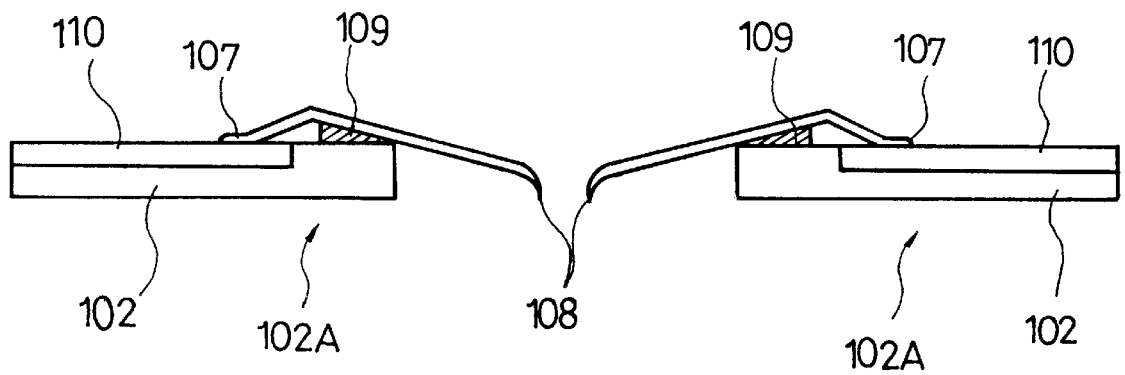
FIG. 13B is a cross-sectional view of the probe card having a vertical type needle shown in FIG. 13A.
Figure 14A:
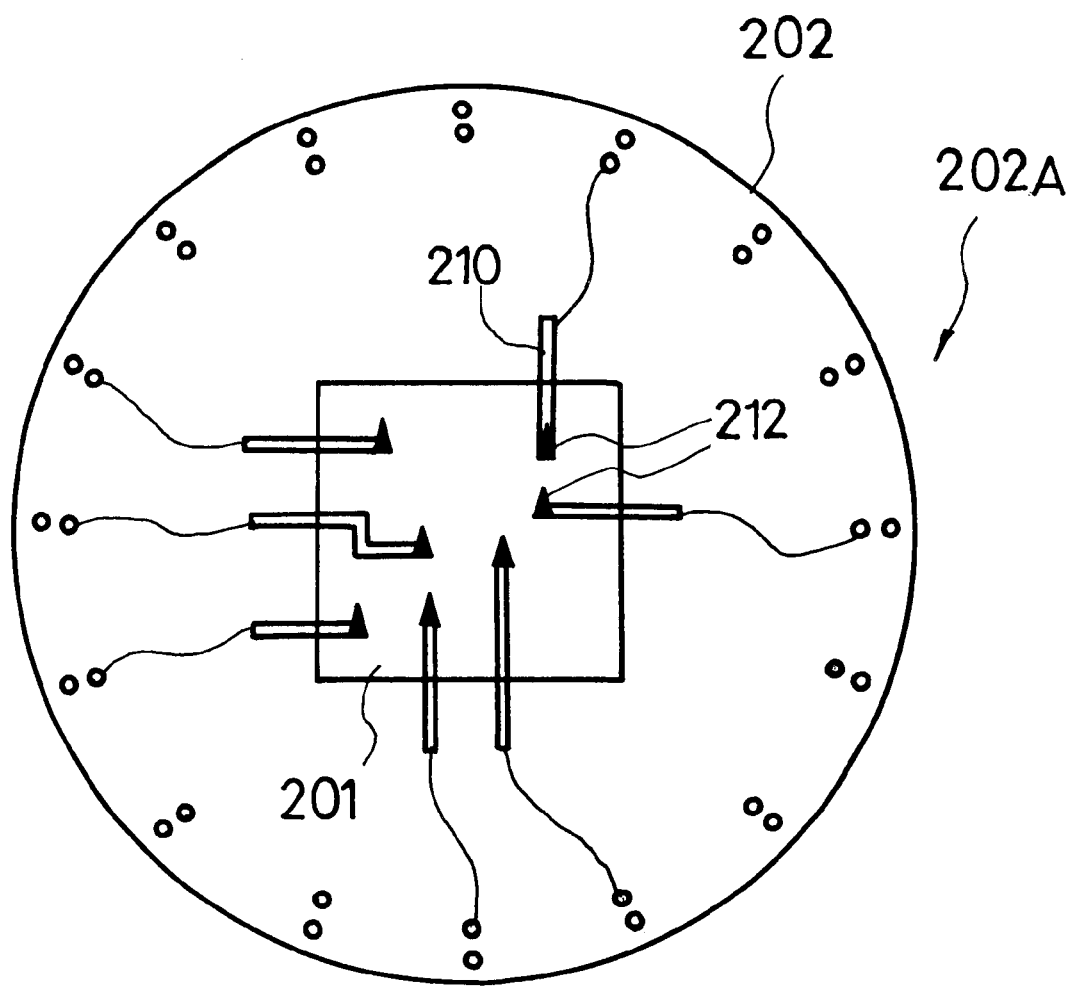
FIG. 14A is a top view of a dot probe card of membrance type for performing a probing test of an IC chip according to the another prior art.
Figure 14B:
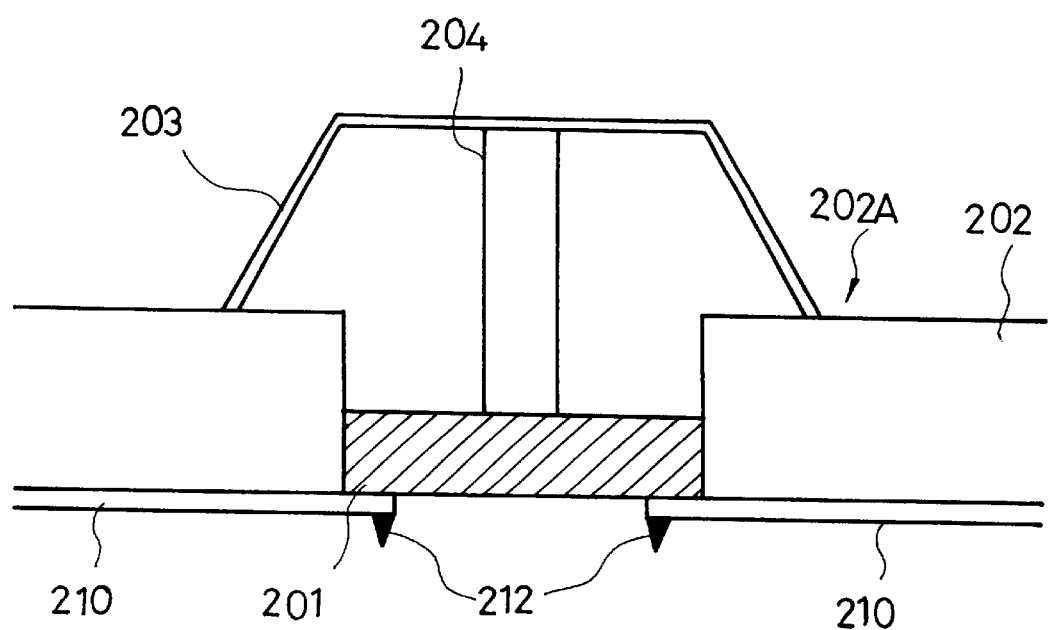
FIG. 14B is a cross-sectional view of the dot probe card of membrance shown in FIG. 14A.

FIG. 11 shows a variety of mask patterns for forming a wafer probe card having a silicon micro tip according to the present invention, in which a silicon micro tip having a desired pattern can be manufactured by manufacturing a desired type's mask pattern.

As described above, wafer probe cards having a silicon micro tip have the same material as that of the wafer on which a semi-conductor IC chip is formed. Accordingly, the physical characteristics of wafer probe cards are the same as that of the wafer.

As a result, the present invention has the following advantages; that is, during a probing test, correspondence between a tested wafer and a testing wafer is excellent to thereby be available for application in a variety of tests.

Furthermore, since the manufacturing method directly uses the general wafer fabrication process, the method is simple, and since an automatic process is used, the manufacturing efficiency is improved and the manufacturing cost are reduced.

Also, according to the present invention, a process for wafer probing test is automatically accomplished and simplified, to thereby reduce the test cost significantly.

Furthermore, a burn-in test in a wafer state is possible, which can not be accomplished in the case of the conventional method. As the signal transfer portion of silicon micro tip have a total length of below 100 μm, the probing test can be applied to any type of device including the device with a high operating frequency. Also, as the probe card according to the present invention is manufactured by using the existing wafer fabrication technology and micro machining technology, it is easy to make a standardize, mass-produce, reproduction to thereby bring costs down.

Also, as the signal transfer circuit of the micro tip can be integrated on the same wafer, the printed circuit board of the conventional method is not necessary and the signal to noise characteristic is better than that of the prior art.

Also, the number, size, height, angle, tension and shape of the micro tip in contact with each pad can be freely controlled. Accordingly, undesired failures which can occur on contacting is minimized and the reliability of contact is maximized.

What is claimed is:

1. A wafer type probe card for testing at least one integrated circuit chip on a semiconductor wafer, the probe card comprising:

a substrate including an upper surface and a lower surface;

a cavity located in the upper surface of the substrate;

a main layer disposed on at least a portion of the upper surface of the substrate, the main layer including an extension that extends across at least a portion of the cavity and a generally uniform thickness;

a sub-layer disposed on at least a portion of the main layer and the extension, the sub-layer having a generally uniform thickness;

a micro tip formed by at least a portion of the extension of the main layer and the sub-layer, the micro tip including a distal end with an extremity that curves only outwardly and is spaced away from the upper surface of the substrate, the extremity of the distal end being sized and configured to contact a corresponding pad on an integrated circuit chip; and means for curving the distal end of the micro tip outwardly from the upper surface of the substrate such that the extremity at the distal end is sized and configured to contact the corresponding pad on the integrated circuit chip.

2. The wafer type probe card of claim 1, wherein the means for curving the micro tip outwardly from the upper surface of the substrate includes a thermal expansion coefficient of the sub-layer that is different than a thermal expansion coefficient of the main layer.

3. The wafer type probe card of claim 1, further comprising one or more articulations disposed in the main layer, the articulations being sized and configured for controlling an angle of curvature of the micro tip.

4. The wafer type probe card of claim 3, wherein the articulations are an n+ type articulation.

5. The wafer type probe card of claim 1, wherein the main layer is an n-type epitaxial layer.

6. The wafer type probe card of claim 1, wherein the main layer has a resistivity of about 10Ω.

7. The wafer type probe card of claim 1, wherein the main layer has a thickness of between about 2 μm and about 10 μm.

8. The wafer type probe card of claim 1, wherein the main layer is composed mainly of silicon.

9. The wafer type probe card of claim 1, wherein the main layer is composed mainly of polysilicon.

10. The wafer type probe card of claim 1, wherein the sub-layer includes a thermal oxide layer and the sub-layer includes silicon nitride and multi-layer.

11. The wafer type probe card of claim 10, further comprising a metal silicide formed on the thermal oxide layer.

12. The wafer type probe card of claim 1, wherein the sub-layer comprises a thin film.

13. The wafer type probe card of claim 1, wherein the sub-layer comprises a metal that is capable of forming a silicide.

14. The wafer type probe card of claim 1, wherein the sub-layer includes a first layer on the upper surface of the extension of the main layer and a second layer on the lower surface of the extension of the main layer.

15. The wafer type probe card of claim 3, wherein the articulations are composed mainly of phosphorous.

16. The wafer type probe card of claim 3, wherein the articulations are formed from porous silicon.

* * * * *

UNITED STATES PATENT AND TRADEMARK OFFICE
CERTIFICATE OF CORRECTION

PATENT NO. : 6,466,042 B1
DATED : October 15, 2002
INVENTOR(S) : Jae Woo Nam

It is certified that error appears in the above-identified patent and that said Letters Patent is hereby corrected as shown below:

Column 1,
Line 29, after "formed" change "is" to -- and --

Column 2,
Line 19, change "limiteds" to -- limits --
Line 26, after "FIGS." delete ","
Line 27, change "show." to -- shown. --
Line 27, change "the" to -- The --
Line 36, change "units" to -- unit --
Line 39, change "are" to -- is --
Line 40, before "type" delete the extra space Column 4,
Line 47, change "EMBODIMENT" to -- EMBODIMENTS --
Line 48, delete "-"

Column 7,
Line 13, delete "the"

Signed and Sealed this

Eighteenth Day of February, 2003

JAMES E. ROGAN
*Director of the United States Patent and Trademark Office*